United States Patent
Eom et al.

(10) Patent No.: US 11,682,627 B2
(45) Date of Patent: Jun. 20, 2023

(54) SEMICONDUCTOR PACKAGE INCLUDING AN INTERPOSER

(71) Applicant: SK hynix Inc., Icheon-si Gyeonggi-do (KR)

(72) Inventors: Ju Il Eom, Yongin-si Gyeonggi-do (KR); Jae Hoon Lee, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 128 days.

(21) Appl. No.: 16/900,342

(22) Filed: Jun. 12, 2020

(65) Prior Publication Data

US 2021/0167017 A1 Jun. 3, 2021

(30) Foreign Application Priority Data

Nov. 29, 2019 (KR) .................. 10-2019-0157705

(51) Int. Cl.
| | |
|---|---|
| *H01L 23/00* | (2006.01) |
| *H01L 23/538* | (2006.01) |
| *H01L 23/498* | (2006.01) |
| *H01L 25/18* | (2023.01) |

(52) U.S. Cl.
CPC .... *H01L 23/5385* (2013.01); *H01L 23/49833* (2013.01); *H01L 23/49838* (2013.01); *H01L 24/06* (2013.01); *H01L 24/13* (2013.01); *H01L 24/45* (2013.01); *H01L 24/73* (2013.01); *H01L 25/18* (2013.01); *H01L 2224/73101* (2013.01); *H01L 2924/1431* (2013.01); *H01L 2924/1434* (2013.01)

(58) Field of Classification Search
CPC ...... H01L 24/06; H01L 24/05; H01L 23/5385
See application file for complete search history.

(56) References Cited

U.S. PATENT DOCUMENTS

| | | | |
|---|---|---|---|
| 9,418,962 B2 | 8/2016 | Pagaila | |
| 9,685,400 B2 | 6/2017 | Hwang et al. | |
| 2002/0136054 A1* | 9/2002 | Blodgett | G11C 11/56 |
| | | | 365/185.03 |
| 2008/0237310 A1* | 10/2008 | Periaman | H01L 25/18 |
| | | | 228/180.5 |
| 2009/0084588 A1* | 4/2009 | Sekine | H01L 23/481 |
| | | | 174/257 |

(Continued)

*Primary Examiner* — Michele Fan
(74) *Attorney, Agent, or Firm* — William Park & Associates Ltd.

(57) ABSTRACT

A semiconductor package includes a package substrate, a lower chip, an interposer, and an upper chip which are stacked on the package substrate, and bonding wires electrically connecting the lower chip to the package substrate. The lower chip includes first and second lower chip pads spaced apart from each other on an upper surface of the lower chip, wire bonding pads bonded to the bonding wires on the upper surface of the lower chip, and lower chip redistribution lines electrically connecting the second lower chip pad to the wire bonding pad. The interposer includes an upper chip connection pad on an upper surface of the interposer, a lower chip connection pad on a lower surface of the interposer, and a through via electrode electrically connecting the upper chip connection pad to the lower chip connection pad.

17 Claims, 8 Drawing Sheets

(56) References Cited

U.S. PATENT DOCUMENTS

| | | | |
|---|---|---|---|
| 2013/0187292 A1* | 7/2013 | Semmelmeyer | H05K 1/144 |
| | | | 257/777 |
| 2014/0159247 A1* | 6/2014 | Lyne | H01L 25/50 |
| | | | 257/774 |
| 2016/0148913 A1* | 5/2016 | Hwang | H01L 23/481 |
| | | | 257/621 |
| 2018/0374788 A1* | 12/2018 | Nakagawa | H01L 24/06 |

* cited by examiner

SEMICONDUCTOR PACKAGE INCLUDING AN INTERPOSER

CROSS-REFERENCE TO RELATED APPLICATION

The present application claims priority under 35 U.S.C. 119(a) to Korean Patent Application No. 10-2019-0157705, filed on Nov. 29, 2019, which is herein incorporated by reference in its entirety.

BACKGROUND

1. Technical Field

The present disclosure relates generally to a semiconductor package and, more particularly, to a semiconductor package having an interposer.

2. Related Art

In general, a semiconductor package is configured to include a substrate and a semiconductor chip mounted on the substrate. The semiconductor chip can be electrically connected to the substrate through connection members such as bumps or wires.

Recently, in accordance with a demand for high performance and high integration of a semiconductor package, various structures of a semiconductor package for stacking a plurality of semiconductor chips on a substrate have been proposed. As an example, a technique of electrically connecting the plurality of semiconductor chips stacked on a substrate to each other using wire bonding or a through silicon via (TSV) technique has been proposed.

SUMMARY

According to an embodiment, a semiconductor package may include a package substrate, a lower chip, an interposer, and an upper chip which are stacked on the package substrate, and bonding wires electrically connecting the lower chip to the package substrate. The lower chip may include first and second lower chip pads spaced apart from each other on an upper surface of the lower chip and electrically connected to each other by internal wirings of the lower chip, wire bonding pads bonded to the bonding wires on the upper surface of the lower chip, and lower chip redistribution lines electrically connecting the second lower chip pad to the wire bonding pad. The interposer may include an upper chip connection pad electrically connected to the upper chip on an upper surface of the interposer, a lower chip connection pad electrically connected to the first lower chip pad on a lower surface of the interposer, and a through via electrode electrically connecting the upper chip connection pad to the lower chip connection pad.

According to another embodiment, a semiconductor package may include a package substrate, a lower chip disposed on the package substrate and electrically connected to the package substrate through wire bonding, an interposer disposed on the lower chip and including a through via electrode electrically connected to the lower chip, and an upper chip disposed on the interposer and electrically connected to the through via electrode. The upper chip is electrically connected to the package substrate through the interposer and the lower chip.

According to yet another embodiment, a semiconductor package may include a package substrate, a first stack structure disposed on the package substrate, a second stack structure disposed on the first stack structure, a first bonding wire electrically connecting the package substrate to the first lower chip of the first stack structure, and a second bonding wire electrically connecting the package substrate to the second lower chip of the second stack structure. The first stack structure includes a first lower chip, a first interposer, and a first upper chip, and the second stack structure includes a second lower chip, a second interposer, and a second upper chip. The first interposer includes a first through via electrode electrically connecting the first lower chip to the first upper chip, and the second interposer includes a second through via electrode electrically connecting the second lower chip to the second upper chip. The first upper chip is electrically connected to the package substrate through the first interposer and the first lower chip, and the second upper chip is electrically connected to the package substrate through the second interposer and the second lower chip.

DETAILED DESCRIPTION

The terms used herein may correspond to words selected in consideration of their functions in presented embodiments, and the meanings of the terms may be construed to be different according to those of ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong. In the description of examples of the present disclosure, descriptions such as "first" and "second," "top" and "bottom or lower," "left" and "right" are used to distinguish members and is not used to limit the member itself or to mean a particular order.

The semiconductor chips described herein may include a form in which a semiconductor substrate into which an electronic circuit is integrated is cut into a die. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor chips may be referred to as semiconductor dies according to their shape after the die sawing process.

In this specification, the semiconductor package may include a package substrate on which semiconductor chips are mounted. The package substrate may include at least one layer of integrated circuit patterns and may be referred to as a printed circuit board (PCB) in the present specification.

The semiconductor package may, as an embodiment, include a plurality of semiconductor chips mounted on the package substrate. In the semiconductor package, any one of the plurality of semiconductor chips may be configured as a master chip, and the remaining semiconductor chips may be configured as a slave chip. Then, the semiconductor package may control the memory cells of the slave chips using the master chip. The master chip may directly exchange signals with the package substrate, and the slave chips may exchange signals with the package substrate through the master chip.

The semiconductor package may be employed in various communication systems such as mobile phones, electronic systems associated with biotechnology or health care, or wearable electronic systems.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 1:
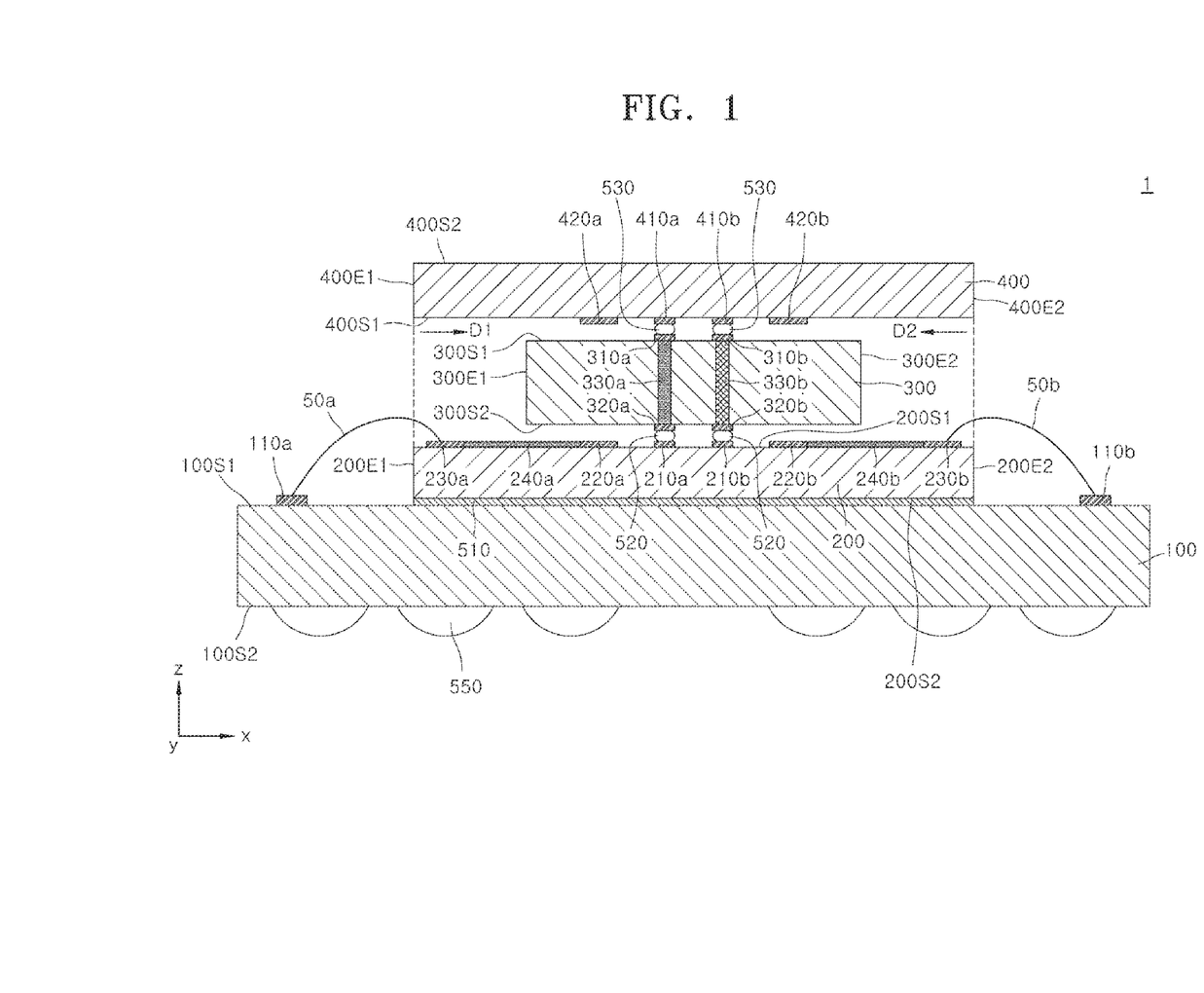
FIG. 1 is a cross-sectional view schematically illustrating a semiconductor package according to an embodiment of the present disclosure.

FIG. 1 is a cross-sectional view schematically illustrating a semiconductor package 1 according to an embodiment of the present disclosure. Referring to FIG. 1, the semiconductor package 1 may include a lower chip 200, an interposer 300, and an upper chip 400 stacked on a package substrate 100. The semiconductor package 1 may include bonding wires 50a and 50b electrically connecting the lower chip 200 to the package substrate 100.

The lower chip 200 and the upper chip 400 may be semiconductor chips including integrated circuits. The lower chip 200 may be electrically connected to the package substrate 100 by a wire bonding method using the bonding wires 50a and 50b. Accordingly, the lower chip 200 may directly exchange electric signals with the package substrate 100. On the other hand, the upper chip 400 may first be electrically connected to the lower chip 200 using though via electrodes 330a and 330b in the interposer 300, and then may be electrically connected to the package substrate 100 through the lower chip 200. That is, the upper chip 400 may exchange electric signals with the package substrate 100 through the interposer 300 and the lower chip 200.

Referring to FIG. 1, the package substrate 100 may be provided. The package substrate 100 may have an upper surface 100S1 and a lower surface 100S2 opposite to the upper surface 100S1. Although not shown, the package substrate 100 may include at least one layer of integrated circuit patterns.

Connection pads 110a and 110b for wire bonding with the lower chip 200 may be disposed on the upper surface 100S1 of the package substrate 100. Moreover, connection structures 550 for electrical connection with other semiconductor packages or PCBs may be disposed on the lower surface 100S2. The connection structures 550 may include, for example, bumps, solder balls, and the like.

The lower chip 200 may be disposed on the package substrate 100. The lower chip 200 may be bonded to the package substrate 100 by an adhesive layer 510. The adhesive layer 510 may include a polymer material having nonconductivity.

The lower chip 200 may have an upper surface 200S1 and a lower surface 200S2. In addition, first lower chip pads 210a and 210b and second lower chip pads 220a and 220b may be spaced apart from each other on the upper surface 200S1 of the lower chip 200. The first lower chip pads 210a and 210b may be connected to lower chip connection pads 320a and 320b of the interposer 300, respectively, by first bumps 520.

The second lower chip pads 220a and 220b may be spaced apart from the first lower chip pads 210a and 210b, respectively, in a lateral direction (i.e., in a direction parallel to the x-direction). The second lower chip pads 220a and 220b may be electrically connected to the first lower chip pads 210a and 210b, respectively, by internal wirings (not illustrated) of the lower chip 200.

Wire bonding pads 230a and 230b may be disposed in edge regions of the upper surface 200S1 of the lower chip 200. The wire bonding pads 230a and 230b may contact the bonding wires 50a and 50b, respectively. The wire bonding pads 230a and 230b may be electrically connected to the second lower chip pads 220a and 220b by lower chip redistribution lines 240a and 240b, respectively.

The interposer 300 may be disposed over the lower chip 200. The interposer 300 may have an upper surface 300S1 and a lower surface 300S2. The lower chip connection pads 320a and 320b electrically connected to the lower chip 200 may be disposed on the lower surface 300S2. As described above, the lower chip connection pads 320a and 320b may be connected to the first lower chip pads 210a and 210b of the lower chip 200, respectively, by the first bumps 520. Meanwhile, upper chip connection pads 310a and 310b electrically connected to the upper chip 400 may be disposed on the upper surface 300S1. As described below, the upper chip connection pads 310a and 310b may be connected to first upper chip pads 410a and 410b, respectively, by second bumps 530.

Referring to FIG. 1 again, edge portions of the interposer 300 may be disposed at positions recessed in the lateral direction from the edge portions of the lower chip 200 and the upper chip 400. As an example, a sidewall surface 300E1 of the interposer 300 may be disposed at a position recessed in the lateral direction (i.e., in the D1 direction parallel to the x-axis) from a sidewall surface 200E1 of the lower chip 200 and a sidewall surface 400E1 of the upper chip 400. Likewise, the other sidewall surface 300E2 of the interposer 300 may be disposed at a position recessed in the lateral direction (i.e., in the D2 direction parallel to the x-axis) from the other sidewall surface 200E2 of the lower chip 200 and the other sidewall surface 400E2 of the upper chip 400. Accordingly, the width along the direction parallel to the x-axis in the interposer 300 may be smaller than the width along the direction parallel to the x-axis in the lower chip 200 and the upper chip 400. At least a portion of the bonding wires 50a and 50b may be accommodated in the recessed space. Accordingly, the bonding between the wire bonding pads 230a and 230b of the lower chip 200 and the bonding wires 50a and 50b can be stably performed.

The interposer 300 may include through via electrodes 330a and 330b electrically connecting the upper chip connection pads 310a and 310b to the lower chip connection 320a and 320b, respectively. In an embodiment, as described below with reference to FIGS. 4A, 4B, and 5, the interposer 300 may further include first to fourth interposer redistribution lines 341, 342, 351, and 352 to be disposed on the upper surface 300S1 and the lower surface 300S2, in order to connect the upper chip connection pads 310a and 310b and the lower chip connection pads 3220a and 320b to the through via electrodes 330a and 330b, respectively.

The upper chip 400 may be disposed over the interposer 300. The upper chip 400 may have an upper surface 400S1 and a lower surface 400S2. First upper chip pads 410a and 410b and second upper chip pads 420a and 420b may be disposed on the upper surface 400S1 of the upper chip 400, facing the interposer 300. The first upper chip pads 410a and 410b may be connected to the upper chip connection pads 310a and 310b of the interposer 300, respectively, by the second bumps 530. The second upper chip pads 420a and 420b may be spaced apart from the first upper chip pads 410a and 410b in the lateral direction (i.e., in a direction parallel to the x-direction) and might not participate in electrical connection with external devices including the interposer 300, the lower chip 200, and the package substrate 100.

In an embodiment, the lower chip 200 and the upper chip 400 may be the same type of chips. However, the lower chip 200 may further include the wire bonding pads 230a and 230b and the lower chip redistribution lines 240a and 240b on the upper surface 200S1 of the lower chip 200 as compared to the upper chip 400. In this case, the lower chip redistribution lines 240a and 240b may be connected to the second lower chip pads 220a and 220b. The lower chip 200 and the upper chip 400 may be disposed to overlap each other in a direction parallel to the z-axis.

In other embodiments not illustrated, the lower chip 200 and the upper chip 400 may have the same configuration. That is, the upper chip 400 may include wire bonding pads in edge regions of the upper surface, and further include upper chip redistribution lines electrically connecting the wire bonding pads to the second upper chip pads 420a and 420b. However, in this case, the wire bonding pads of the upper chip are not electrically connected to the package substrate 100 by the bonding wires.

In an embodiment, the lower chip 200 and the upper chip 400 may be memory chips. In this case, the lower chip 200 may be a master chip and the upper chip 400 may be a slave chip. The lower chip 200 may be directly and electrically connected to the package substrate 100 using the bonding wires 50a and 50b. The upper chip 400 may first be electrically connected to the lower chip 200 through the through via electrodes 330a and 330b and then may be electrically connected to the package substrate 100 through the internal wirings, the input/output circuits, and the bonding wires 50a and 50b of the lower chip 200.

Figure 2:
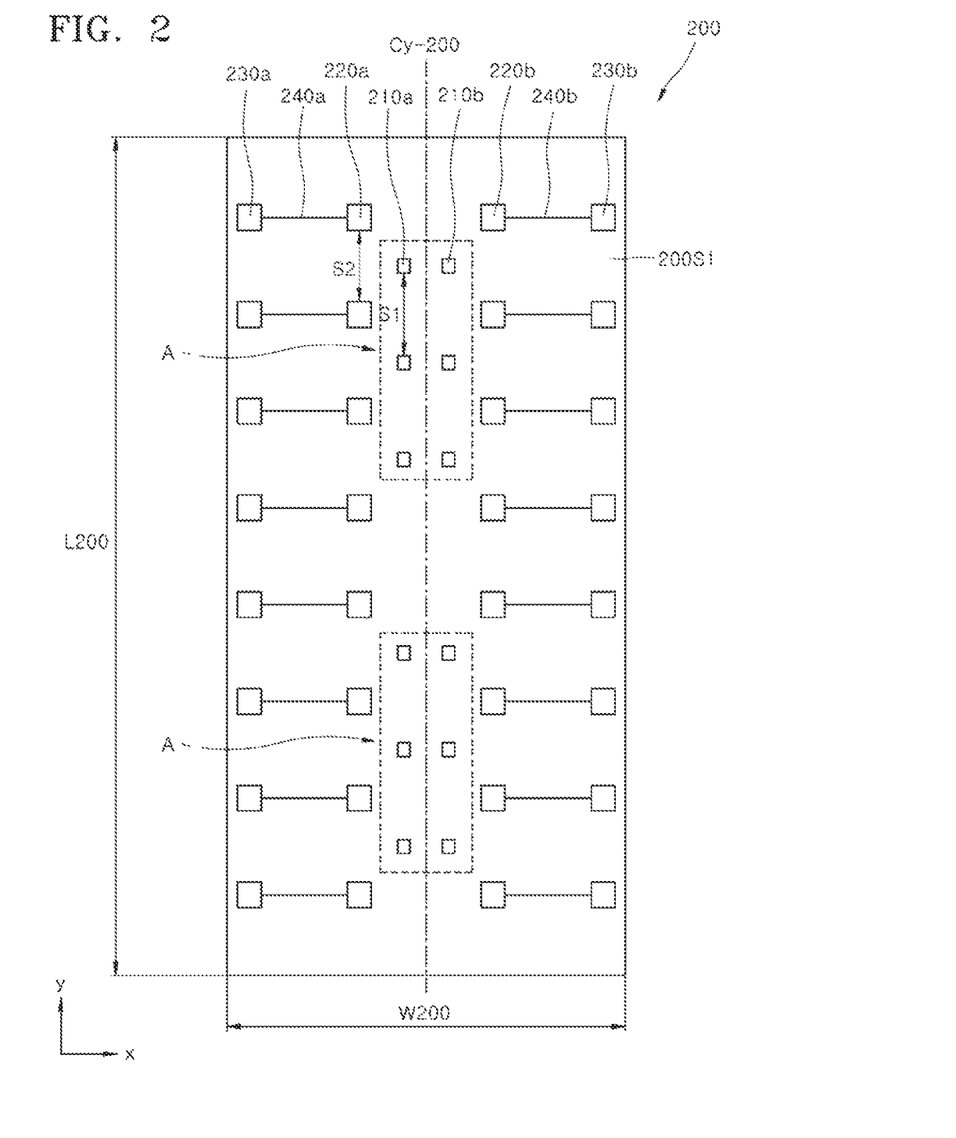
FIGS. 2 and 3 are plan views schematically illustrating semiconductor chips according to embodiments of the present disclosure.
Figure 3:
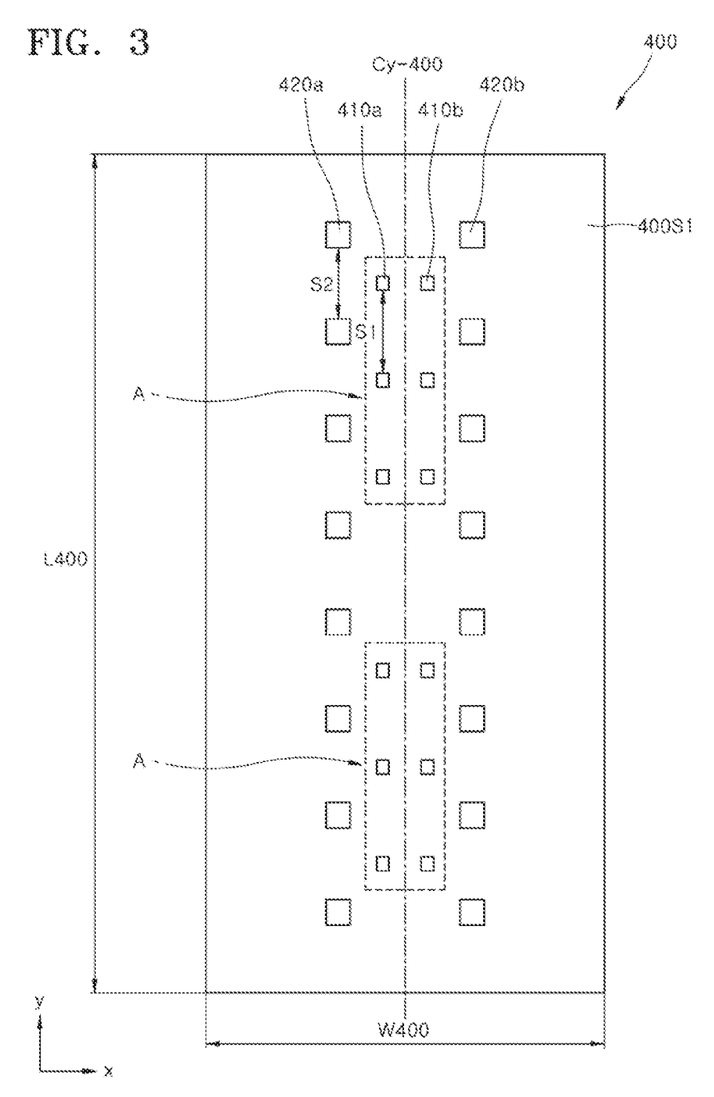
Figure 4A:
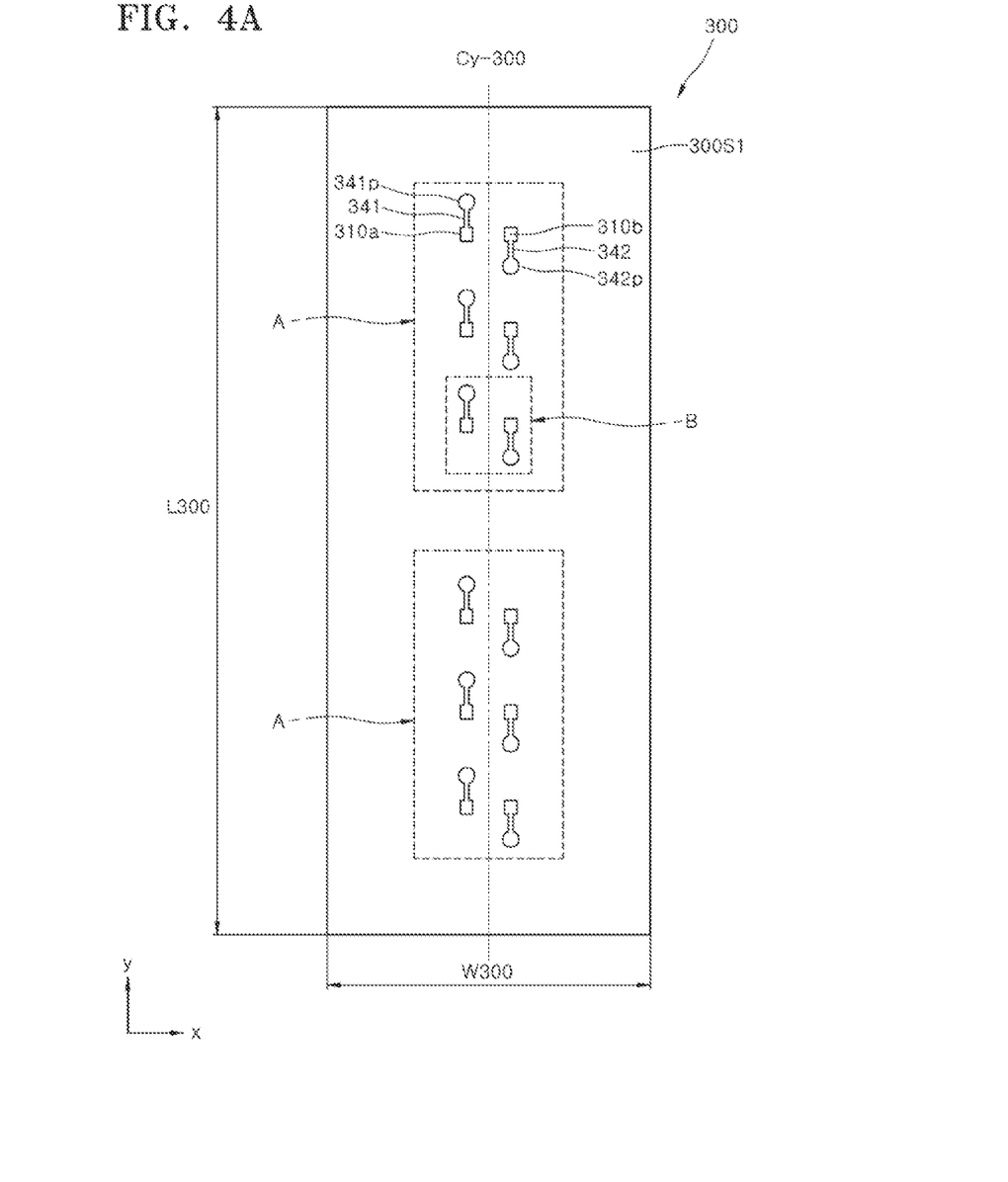
FIGS. 4A and 4B are views schematically illustrating an interposer of a semiconductor package according to an embodiment of the present disclosure.
Figure 4B:
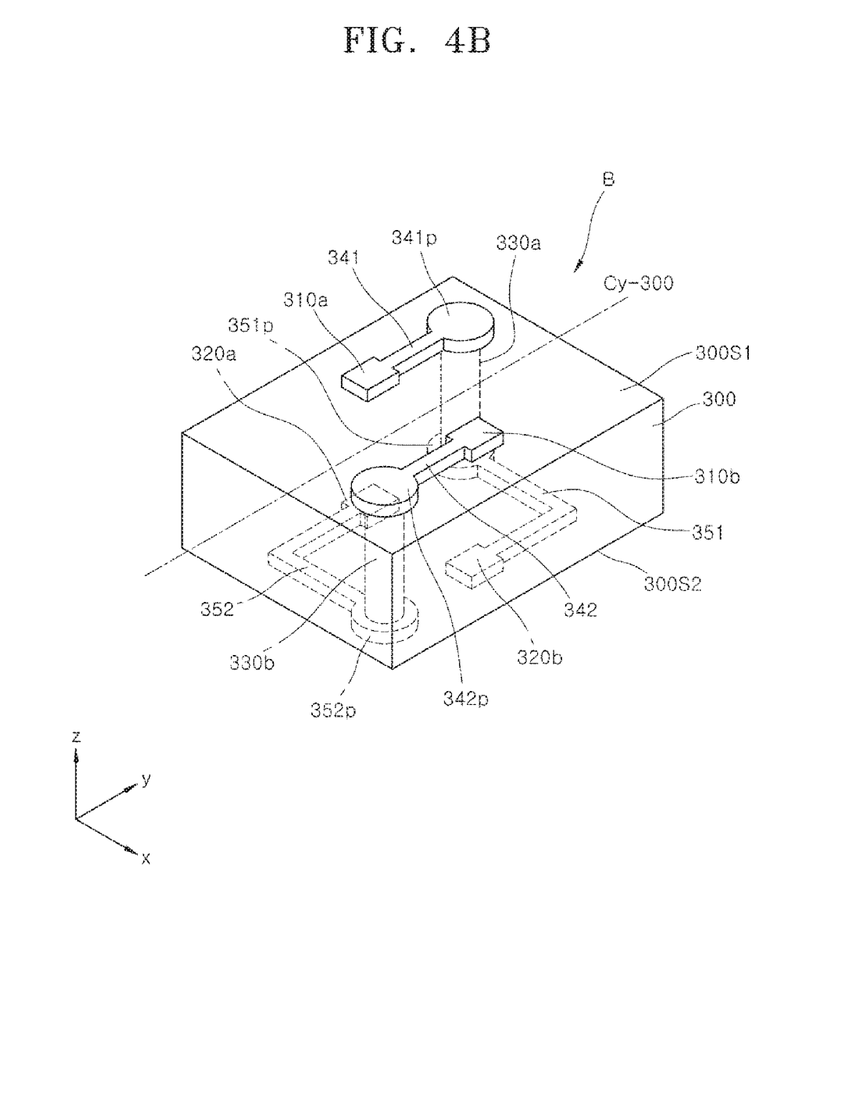

FIGS. 2 and 3 are plan views schematically illustrating semiconductor chips of a semiconductor package according to an embodiment of the present disclosure. Specifically, FIG. 2 schematically illustrates the lower chip 200 of FIG. 1. FIG. 3 schematically illustrates the upper chip 400 of FIG. 1. FIGS. 4A and 4B are views schematically illustrating an interposer of a semiconductor package according to an embodiment of the present disclosure. More specifically, FIG. 4A is a plan view schematically illustrating the interposer 300 of FIG. 1, and FIG. 4B is a perspective view of a portion B of a through via electrode arrangement region A of FIG. 4A.

Referring to FIG. 2, the lower chip 200 may have a minor axis along a direction parallel to the x-axis and a major axis along a direction parallel to the y-axis. In addition, the lower chip 200 may have a central axis Cy-200 disposed along the major axis. The lower chip 200 may have a predetermined width W200 in the minor axis direction and a predetermined length L200 in the major axis direction. The central axis Cy-200 may be configured to cross half the width W200 of the lower chip 200.

The first lower chip pads 210a and 210b, the second lower chip pads 220a and 220b, and the wire bonding pads 230a and 230b may be arranged on the upper surface 200S1 of the lower chip 200 in the major axis direction (i.e., a direction parallel to the y-direction). The first lower chip pads 210a and 210b, the second lower chip pads 220a and 220b, and the wire bonding pads 230a and 230b may be disposed to form pairs symmetrical with respect to the central axis Cy-200, respectively. In a specific embodiment, the first lower chip pads 210a and 210b may be disposed closer to the central axis Cy-200 than the second lower chip pads 220a and 220b and the wire bonding pads 230a and 230b. In addition, the second lower chip pads 220a and 220b may be disposed closer to the central axis Cy-200 than the wire bonding pads 230a and 230b.

The first lower chip pads 210a and 210b may be classified into a first lower chip left pad 210a and a first lower chip right pad 210b, based on the central axis Cy-200. The second lower chip pads 220a and 220b may be classified into a second lower chip left pad 220a and a second lower chip right pad 220b, based on the central axis Cy-200. The wire bonding pads 230a and 230b may be classified into a wire bonding left pad 230a and a wire bonding right pad 230b, based on the central axis Cy-200.

As illustrated in FIG. 2, a surface area of each of the first lower chip pads 210a and 210b may be smaller than a surface area of each of the second lower chip pads 220a and 220b. As an example, the first lower chip pads 210a and 210b may each have a smaller size than the second lower chip pads 220a and 220b.

The first lower chip pads 210a and 210b may be relatively densely arranged in the through via electrode arrangement region A, as compared with the second lower chip pads 220a and 220b. The first lower chip pads 210a and 210b may be arranged at predetermined intervals S1 along the central axis Cy-200 in the through via electrode arrangement region A. Meanwhile, the second lower chip pads 220a and 220b may be continuously arranged at the same predetermined interval S2 along the central axis Cy-200 outside of the through via electrode arrangement region A. When the first lower chip pads 210a and 210b are arranged along a direction parallel to the y-axis, the first lower chip pads 210a and 210b may be disposed between the second lower chip pads 220a and 220b. That is, the first lower chip pads 210a and 210b and the second lower chip pads 220a and 220b may be alternately arranged in a direction parallel to the y-axis.

Referring to FIGS. 1 and 2 together, electrical signals may be communicated between the first lower chip pads 210a and 210b of the lower chip 200 and the first upper chip pads 410a and 410b of the upper chip 400, through the through via electrodes 330a and 330b. That is, the first lower chip pads 210a and 210b may function as signal input/output pads of the lower chip 200 to exchange electrical signals with the upper chip 400.

Referring back to FIG. 1, the lower chip redistribution lines 240a and 240b may be disposed on the upper surface 200S1 of the lower chip 200. The lower chip redistribution lines 240a and 240b may electrically connect the wire bonding pads 230a and 230b to the second lower chip pads 220a and 220b. The lower chip redistribution lines 240a and 240b may be configured as a pair symmetrical with respect to the central axis Cy-200. In a specific example, the lower chip redistribution lines 240a and 240b may be classified into a lower chip left redistribution line 240a and a lower chip right redistribution line 240b, based on the central axis Cy-200.

As described above, the electric signals reaching the wire bonding pads 230a and 230b from the package substrate 100 through the bonding wires 50a and 50b may be transferred to the second lower chip pads 220a and 220b through the lower chip redistribution lines 240a and 240b, respectively. Subsequently, the electrical signals reaching the second lower chip pads 220a and 220b may be transferred to an internal integrated circuit. Some of the electric signals may be output through the first lower chip pads 210a and 210b to be input to the first upper chip pads 410a and 410b of the upper chip 400 through the through via electrodes 330a and 330b of the interposer 300.

Referring to FIG. 3, the upper chip 400 is disclosed. The upper chip 400 may have a minor axis along a direction parallel to the x-direction and a major axis along a direction parallel to the y-direction. In addition, the upper chip 400 may have a central axis Cy-400 disposed along the major axis. The upper chip 400 may have a predetermined width W400 along the minor axis direction and may have a predetermined length L400 along the major axis direction. The central axis Cy-400 may be configured to cross half of the width W400 of the upper chip 400. In an embodiment, when the upper chip 400 is disposed to overlap the lower chip 200, the central axis Cy-400 of the upper chip 400 may overlap the central axis Cy-200 of the lower chip 200.

First upper chip pads 410a and 410b and second upper chip pads 420a and 420b may be arranged on the upper surface 40051 of the upper chip 400 along the major axis direction (i.e., direction parallel to the y-axis). The first upper chip pads 410a and 410b and the second upper chip pads 420a and 420b may be disposed to form pairs symmetrical with respect to the central axis Cy-400, respectively. In a specific example, the first upper chip pads 410a and 410b may be disposed closer to the central axis Cy-400 than the second upper chip pads 420a and 420b. The first upper chip pads 410a and 410b may be classified into a first upper chip left pad 410a and a first upper chip right pad 410b, based on the central axis Cy-400. The second upper chip pads 420a and 420b may be classified into a second upper chip left pad 420a and a second upper chip right pad 420b, based on the central axis Cy-400.

As illustrated in FIG. 3, the surface area of each of the first upper chip pads 410a and 410b may be smaller than the surface area of each of the second upper chip pads 420a and 420b. As an example, each of the first upper chip pads 410a and 410b may have a smaller size than each of the second upper chip pads 420a and 420b.

The first upper chip pads 410a and 410b may be relatively densely disposed in the through via electrode arrangement region A, as compared with the second upper chip pads 420a and 420b. The first upper chip pads 410a and 410b may be arranged at a predetermined interval S1 along the central axis Cy-400 in the through via electrode arrangement region A. Meanwhile, the second upper chip pads 420a and 420b may be continuously disposed at the same predetermined interval S2 along the central axis Cy-400 on the upper surface 400S1.

Figure 6:
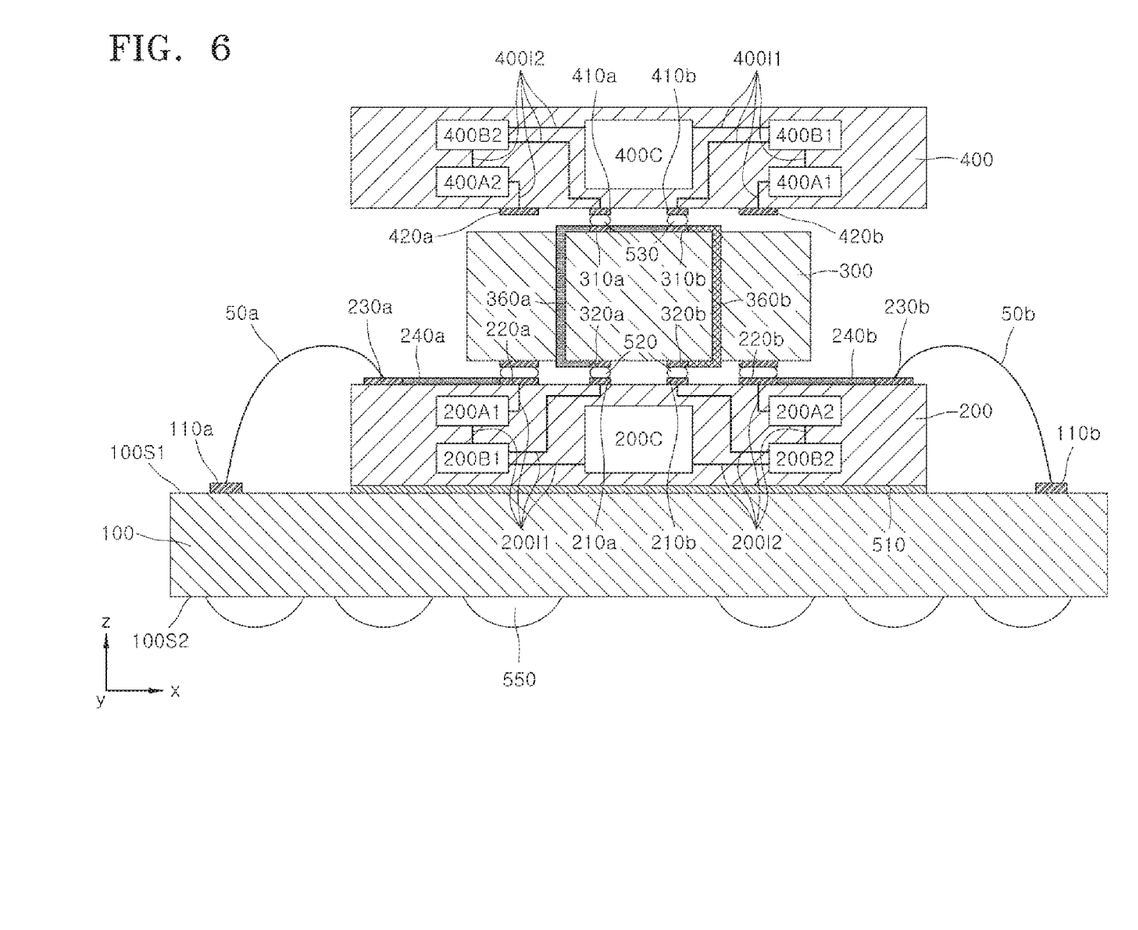
FIG. 6 is a view schematically illustrating an internal circuit configuration of a semiconductor package according to an embodiment of the present disclosure.

Referring to FIGS. 1 and 3 together, the electric signals may communicate between the first upper chip pads 410a and 410b of the upper chip 400 and the first lower chip pads 210a and 210b of the lower chip 200 through the through via electrodes 330a and 330b, respectively. That is, the first upper chip pads 410a and 410b may function as signal input/output pads of the upper chip for exchanging electric signals with the lower chip 200. The second upper chip pads 420a and 420b may be connected to input/output circuit blocks 400A1 and 400A2 inside the upper chip 400, as shown in FIG. 6 to be described later. However, the second upper chip pads 420a and 420b are not directly connected to the components of an external device such as the interposer 300, the lower chip 200, and the package substrate 100. Here, the direct connection may mean that the second upper chip pads 420a and 420b are connected to the external component through external connection structures such as bumps or bonding wires.

In some other embodiments not illustrated, the upper chip 400 may have substantially the same configuration as the lower chip 200 illustrated in FIG. 2. That is, the upper chip 400 may have wire bonding pads in edge regions of the upper surface 400S1. The locations of the wire bonding pads may be the same as the locations of the wire bonding pads 230a and 230b of the lower chip 200 illustrated in FIG. 2. In addition, the upper chip 400 may have upper chip redistribution lines connecting the wire bonding pads to the second upper chip pads 420a and 420b.

Referring to FIGS. 4A and 4B, the interposer 300 may be disposed between the lower chip 200 and the upper chip 400. The interposer 300 may have a minor axis along a direction parallel to the x-direction and a major axis along a direction parallel to the y-direction. In addition, the interposer 300 may have a central axis Cy-300 disposed along the major axis. The interposer 300 may have a predetermined width W300 along the minor axis direction and may have a predetermined length L300 along the major axis direction. The central axis Cy-300 may be configured to cross half the width W300 of the interposer 300. In an embodiment, when the upper chip 400, the interposer 300, and the lower chip 200 are disposed to overlap each other, the central axis Cy-400 of the upper chip 400, the central axis Cy-300 of the interposer 300, and the central axis Cy-200 of the lower chip 200 may overlap each other.

Upper chip connection pads 310a and 310b may be arranged along the major axis direction (i.e., direction parallel to the y-axis) on an upper surface 300S1 of the interposer 300. In an embodiment, the upper chip connection pads 310a and 310b may be configured in pairs symmetrical with respect to the central axis Cy-300, respectively. The upper chip connection pads 310a and 310b may be classified into an upper left pad 310a and an upper right pad 310b that are symmetrical to each other with respect to the central axis Cy-300. The upper left pad 310a and the upper right pad 310b may be spaced apart from each other at predetermined intervals S1 along a direction parallel to the Y-axis. Although not specifically illustrated in FIG. 4A, lower chip connection pads 320a and 320b may be arranged on the lower surface 300S2 of the interposer 300 along the major axis direction. In an embodiment, the lower chip connection pads 320a and 320b may be configured in pairs symmetrical with respect to the central axis Cy-300, respectively. The lower chip connection pads 320a and 320b may be disposed to overlap the upper chip connection pads 310a and 310b.

Referring to FIGS. 4A and 4B, a first interposer redistribution line 341 extending from the upper left pad 310a and reaching a first via extension pad 341p may be disposed along a direction parallel to the y-axis on the upper surface 30051. The first via extension pad 341p may be connected to a first through via electrode 330a. In addition, a second interposer redistribution line 342 extending from the upper right pad 310b and reaching a second via extension pad 342p may be disposed along a direction parallel to the y-axis on the upper surface 300S1. The second via extension pad 342p may be connected to a second through via electrode 330b.

Referring to FIG. 4B, the lower chip connection pads 320a and 320b disposed on the lower surface 300S2 of the interposer 300 may be classified into a lower left pad 320a and a lower right pad 320b that are symmetrical with respect to the central axis Cy-300. In this case, a third interposer redistribution line 351 extending from the lower right pad 320b and reaching a third via extension pad 351p may be disposed along a direction parallel to the y-axis on the lower surface 300S2. The third via extension pad 351p may be connected to the first through via electrode 330a. In addition, a fourth interposer redistribution line 352 extending from the lower left pad 320a and reaching a fourth via extension pad 352p may be disposed along a direction parallel to the y-axis on the lower surface 300S2. The fourth via extension pad 352p may be connected to the second through via electrode 330b.

In an embodiment, the lower left pad 320a may be disposed directly below the upper left pad 310a and disposed to face the upper left pad 310a. In addition, the lower right pad 320b may be disposed directly below the upper right pad 310b and disposed to face the upper right pad 310b. In other words, the lower left pad 320a and the upper left pad 310a may be disposed to overlap each other in the vertical direction (i.e., a direction parallel to the z-axis), and the lower right pad 320b and the upper right pad 310b may be disposed to overlap each other in the vertical direction (i.e., a direction parallel to the z-axis).

Figure 5:
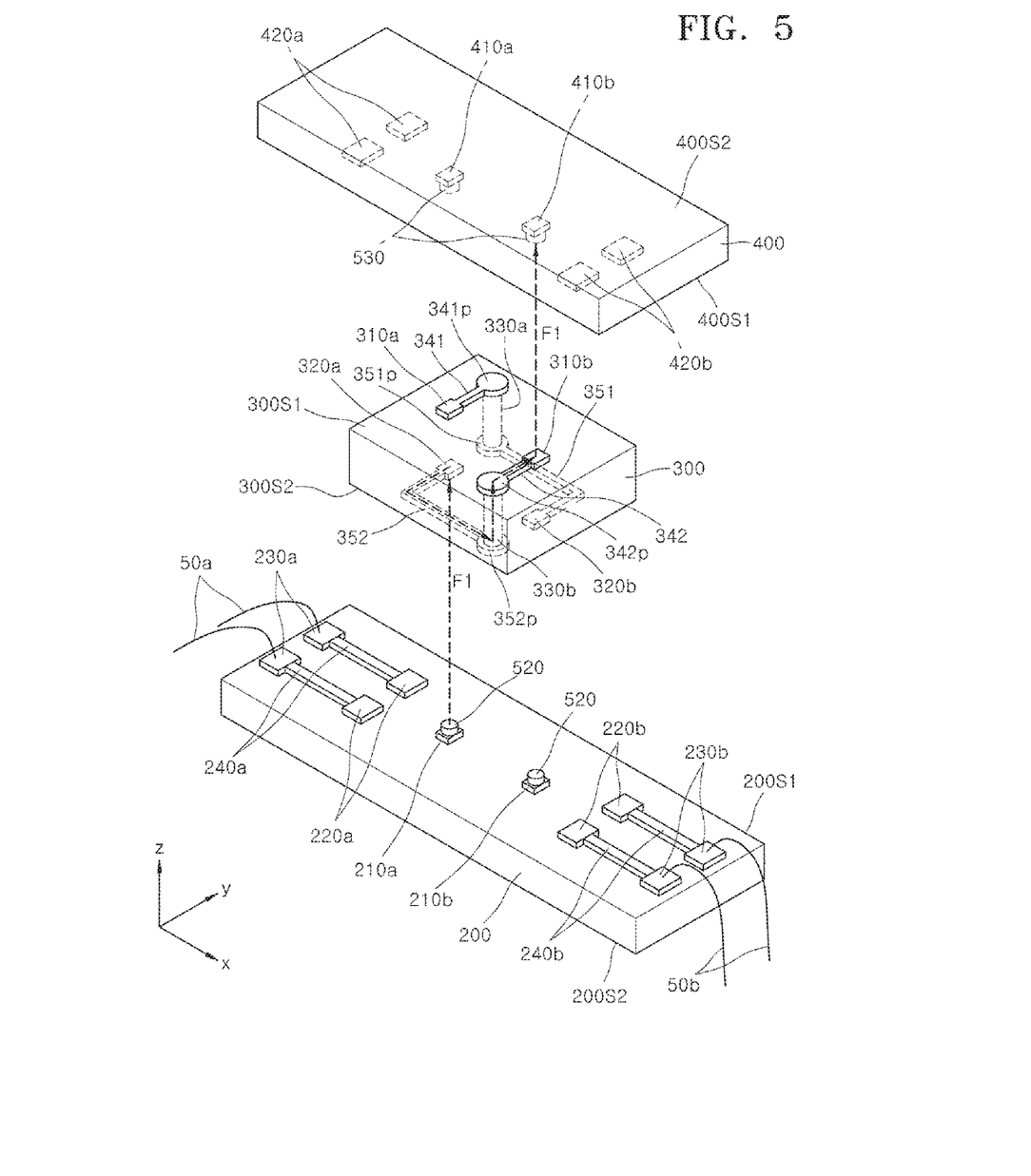
FIG. 5 is a schematic view schematically illustrating a method of exchanging electrical signals between semiconductor chips and a package substrate according to an embodiment of the present disclosure.

FIG. 5 is a schematic view schematically illustrating a method of exchanging electric signals between semiconductor chips and a package substrate according to an embodiment of the present disclosure. In FIG. 5, the method of exchanging electric signals will be described schematically using the configurations of the lower chip 200, the interposer 300, and the upper chip 400 of the semiconductor package 1 described above with reference to FIGS. 1, 2, 3, 4A, and 4B. For the convenience of explanation, the package substrate 100 is not shown in FIG. 5.

Referring to FIG. 5 with FIG. 1, the electric signal exchange between the package substrate 100 and the lower chip 200 may proceed as follows. As an example, the electric signals of the package substrate 100 may be input to the wire bonding left pad 230a and the wire bonding right pad 230b through the bonding wires 50a and 50b, respectively. The input signals may reach the second lower chip left pad 220a and the second lower chip right pad 220b through the lower chip left redistribution line 240a and the lower chip right redistribution line 240b, respectively, and then may move to a function block inside the lower chip 200 through internal wirings. The function block will be described later using FIG. 6. In addition, the semiconductor package 1 may have an electric signal path from the lower chip 200 to the package substrate 100, opposite to the above-described path.

Meanwhile, the electric signal exchange between the package substrate 100 and the upper chip 400 may proceed as follows. As an example, the electric signals may be input from the package substrate 100 to the wire bonding left pad 230a of the lower chip 200 through the bonding wire 50a. The electric signals may be transferred to the second lower chip left pad 220a through the lower chip left redistribution line 240a. The electric signals may reach the first lower chip left pad 210a through the internal circuit wiring. Thereafter, the electric signal may be transferred from the first lower chip left pad 210a to the lower left pad 320a of the interposer 300 through the first bump 520. Subsequently, the electric signals may reach the upper right pad 310b through the fourth interposer redistribution line 352, the fourth via extension pad 352p, the second through via electrode 330b, the second via extension pad 342p, and the second interposer redistribution line 342. The electric signals may reach the first upper chip right pad 410b of the upper chip 400 from the upper right pad 310b through the second bump 530. As such, the semiconductor package 1 may have an electric signal path from the package substrate 100 to the upper chip 400 through the lower chip 200 and the interposer 300. In addition, the semiconductor package 1 may have an electric signal path from the upper chip 400 to the package substrate 100 through the interposer 300 and the lower chip 200, which is opposite to the path. In FIG. 5, a portion of the electric signal path between the lower chip 200 and the upper chip 400 of the electrical signal path between the package substrate 100 and the upper chip 400 is illustrated as 'F1.'

Likewise, as another example, electric signals may be input to the wire bonding right pad 230b of the lower chip 200 from the package substrate 100 through the bonding wire 50b. The electric signals may be transferred to the second lower chip right pad 220b through the lower chip right redistribution line 240b. The electric signals may reach the first lower chip right pad 210b through the internal circuit wiring. Thereafter, the electric signal may be transferred to the lower right pad 320b of the interposer 300 from the first lower chip right pad 210b through the first bump 520. Then, the electric signals may reach the upper left pad 310a through the third interposer redistribution line 351, the third via extension pad 351p, the first through via electrode 330a, the first via extension pad 341p, and the first interposer redistribution line 341. The electric signals may reach the first upper chip left pad 410a of the upper chip 400 from the upper left pad 310a through the second bump 530. As such, the semiconductor package 1 may have an electric signal path from the package substrate 100 to the upper chip 400 through the lower chip 200 and the interposer 300. In addition, the semiconductor package 1 may have an electric signal path from the upper chip 400 to the package substrate 100 through the interposer 300 and the lower chip 200, which is opposite to the path.

FIG. 6 is a view schematically illustrating an internal circuit configuration of a semiconductor package according to an embodiment of the present disclosure. FIG. 6 may be a view schematically illustrating the internal circuit of the semiconductor package 1 described above with reference to FIG. 1.

Referring to FIG. 6, a package substrate 100 may include connection pads 110a and 110b disposed on an upper surface 100S1 and connecting the boding wires 50a and 50b. In addition, the package substrate 100 may include connection structures 550 disposed on a lower surface 100S2 and provided for electrical connection with another semiconductor package or a printed circuit board.

A lower chip 200 may include first and second input/output circuit blocks 200A1 and 200A2, a first address and command circuit block 200B1 connected to the first input/output circuit block 200A1, a first data transmission circuit block 200I32 connected to the second input/output circuit block 200A2, and a first memory cell core block 200C. The first memory cell core block 200C may be connected to the first address and command circuit block 200B1 and the first data transmission circuit block 200B2.

An upper chip 400 may include a second address and command circuit block 400B1 and a second data transmission circuit block 400B2 connected to a pair of the first upper chip pads 210a and 210b, respectively. In addition, the upper chip 400 may include a second memory cell core block 400C connected to the second address and command circuit block 400B1 and the second data transmission circuit block 400B2. The upper chip 400 may have third and fourth input/output circuit blocks 400A1 and 400A2 connected to second upper chip pads 420a and 420b, respectively. However, the second upper chip pads 420a and 420b are not directly connected to external components such as the package substrate 100, the lower chip 200, and the interposer 300.

In an embodiment, the electric signal exchange between the package substrate 100 and the semiconductor chips 200 and 400 may proceed as follows. The electric signals of the package substrate 100 may be input to the second lower chip pads 220a and 220b through the connection pads 110a and 110b, the bonding wires 50a and 50b, the wire bonding pads 230a and 230b of the lower chip 200, and the lower chip redistribution lines 240a and 240b. Among the input electric signals, some input signals along a first lower chip internal wiring 200I1 may pass through the first input/output circuit block 200A1 and be converted into first address and command signals by the first address and command circuit block 200B1, and then may be transferred to the first memory cell core block 200C. Moreover, among the input electric signals, some other input signals along second lower chip internal wiring 200I2 may pass through the second input/output circuit block 200A2 and be converted into data signals by the first data transmission circuit block 200B2, and then may be transferred to the first memory cell core block 200C.

Meanwhile, the first lower chip internal wiring 200I1 of the lower chip 200 may be connected to a first upper chip internal wiring 400I1 of the upper chip 400 through the first lower chip left pad 210a, the first bump 520, the lower left pad 320a of the interposer 300, the first internal wiring 360a of the interposer 300, including the through via electrodes and the redistribution lines, the upper right pad 310b, the second bump 530, and the first upper chip right pad 410b. Accordingly, among the electric signals of the package substrate 100, some electric signals output from the first address and command circuit 200B1 of the lower chip 200 may be input to the second address and command circuit block 400B1 along the first upper chip internal wiring 400I1 of the upper chip 400. The electric signals may be converted into second address and command signals by the second address and command circuit block 400B1, and then be transferred to the second memory cell core block 400C.

Accordingly, in an embodiment of the present disclosure, the upper chip 400 may use an electric signal path via the lower chip 200 and the interposer 300 to exchange electric signals with the package substrate 100. That is, the upper chip 400 might not apply the fourth input/output circuit block 400A1 via the second upper chip right pad 420b.

Likewise, the second lower chip internal wiring 200I2 of the lower chip 200 may be connected to the second upper chip internal wiring 400I2 through the first lower chip right pad 210b, the first bump 520, the lower right pad 320b of the interposer 300, the second internal wiring 360b of the interposer 300, including the through via electrodes and redistribution lines, the upper left pad 310a, the second bump 530, and the first upper chip left pad 410a. Accordingly, among the electric signals of the package substrate 100, some electric signals output from the first data transmission circuit block 200B2 of the lower chip 200 may be input to the second data transmission circuit block 400B2 along the second upper chip internal wiring 400I2. The electric signals may be converted into data signals by the second data transmission circuit block 400B2, and then, transferred to the second memory cell core block 400C.

Meanwhile, referring again to FIG. 6, the electric signals output from the first memory cell core block 200C of the lower chip 200 may pass through the first address and command circuit block 200B1 and the first input/output circuit block 200A1 along the first lower chip internal wiring 200I1 to reach the second lower chip left pad 220a, or may pass through the first data transmission circuit block 200B2 and the second input/output circuit block 200A2 along the second lower chip internal wiring 200I2 to reach the second lower chip right pad 220b. Thereafter, the electric signals may be transmitted to wire bonding pads 230a and 230b through the lower chip redistribution lines 240a and 240b, and then transferred to the package substrate 100 through the bonding wires 50a and 50b.

In addition, the electric signals output from the second memory cell core block 400C of the upper chip 400 may pass through the second address and command circuit block 400B1 along the first upper chip internal wiring 400I1 to reach the first upper chip right pad 410b, or may pass through the second data transmission circuit block 400B2 along the second upper chip internal wiring 400I2 to reach the first upper chip left pad 410a. Thereafter, the electric signals may reach the upper chip connection pads 310a and 310b of the interposer 300 through the second bumps 530. Subsequently, the electric signal may pass through the first and second internal wirings 360a and 360b of the interposer 300 to reach the lower chip connection pads 320a and 320b of the interposer 300. Subsequently, the electric signals may be input to the first lower chip pads 210a and 210b of the lower chip 200 through the first bumps 520. The input electric signals may be transmitted to the second lower chip pads 220a and 220b along the first and second lower chip internal wirings 200I1 and 200I2, respectively. Subsequently, the electric signals may move to the wire bonding pads 230a and 230b through the lower chip redistribution lines 240a and 240b, and then, may be transmitted to the package substrate 100 through the bonding wires 50a and 50b, respectively.

In other words, the first and second input/output circuit blocks 200A1 and 200A2 may receive electric signals of the package substrate 100, respectively, transmitted through the bonding wires 50a and 50b, the wire bonding pads 230a and 230b, the lower chip redistribution lines 240a and 240b, and the second lower chip pads 220a and 220b. Further, the first and second input/output circuit blocks 200A1 and 200A2 may transmit the received electric signals to the first address and command block 200B1 and the first data transmission circuit blocks 200B2, respectively, using the internal wirings of the lower chip 200. The first address and command block 200B1 and the first data transmission circuit blocks 200B2 may receive the transmitted electric signals, respectively. The first address and command block 200B1 and the first data transmission circuit blocks 200B2 transmit the received electric signals to the first memory cell core block 200C of the lower chip 200, respectively.

In addition, the interposer 300 may receive some of the electric signals of the package substrate 100 through the first lower chip pads 320a and 320b. In addition, the interposer 300 may transmit some of the received electric signals to the first upper chip pads 410a and 410b of the upper chip 400 using the internal wirings of the interposer 300. The second address and command block 400B1 and the second data transmission circuit blocks 400B2 may receive the electric signals, respectively, transmitted to the first upper chip pads 410a and 410b using the internal wirings of the upper chip 400. Further, the second address and command block 400B1 and the second data transmission circuit blocks 400B2 may transmit the received electric signals to the second memory cell core block 400C of the upper chip 400, respectively.

As described above, an embodiment of the present disclosure may provide a semiconductor package having a lower chip, an interposer, and an upper chip that are stacked on a package substrate. In the semiconductor package, the lower chip can exchange electric signals with the package substrate using bonding wires. The upper chip is connected to the lower chip through the interposer and can exchange electric signals with the package substrate via the lower chip. Accordingly, the upper chip can omit a direct electrical connection with the package substrate, and as a result, application of input/output circuits in the upper chip, redistribution lines on the upper chip, and wire bonding pads which may be involved in the electrical connection between the upper chip and the package substrate can be avoided. Accordingly, parasitic capacitance generated in the upper chip during the input/output process of the electric signals can be reduced.

Consequently, in an embodiment of the present disclosure, it is possible to provide a semiconductor package structure capable of improving the signal transmission speed of the semiconductor package by reducing the parasitic capacitance generated in the semiconductor chip stacked on the package substrate.

Figure 7:
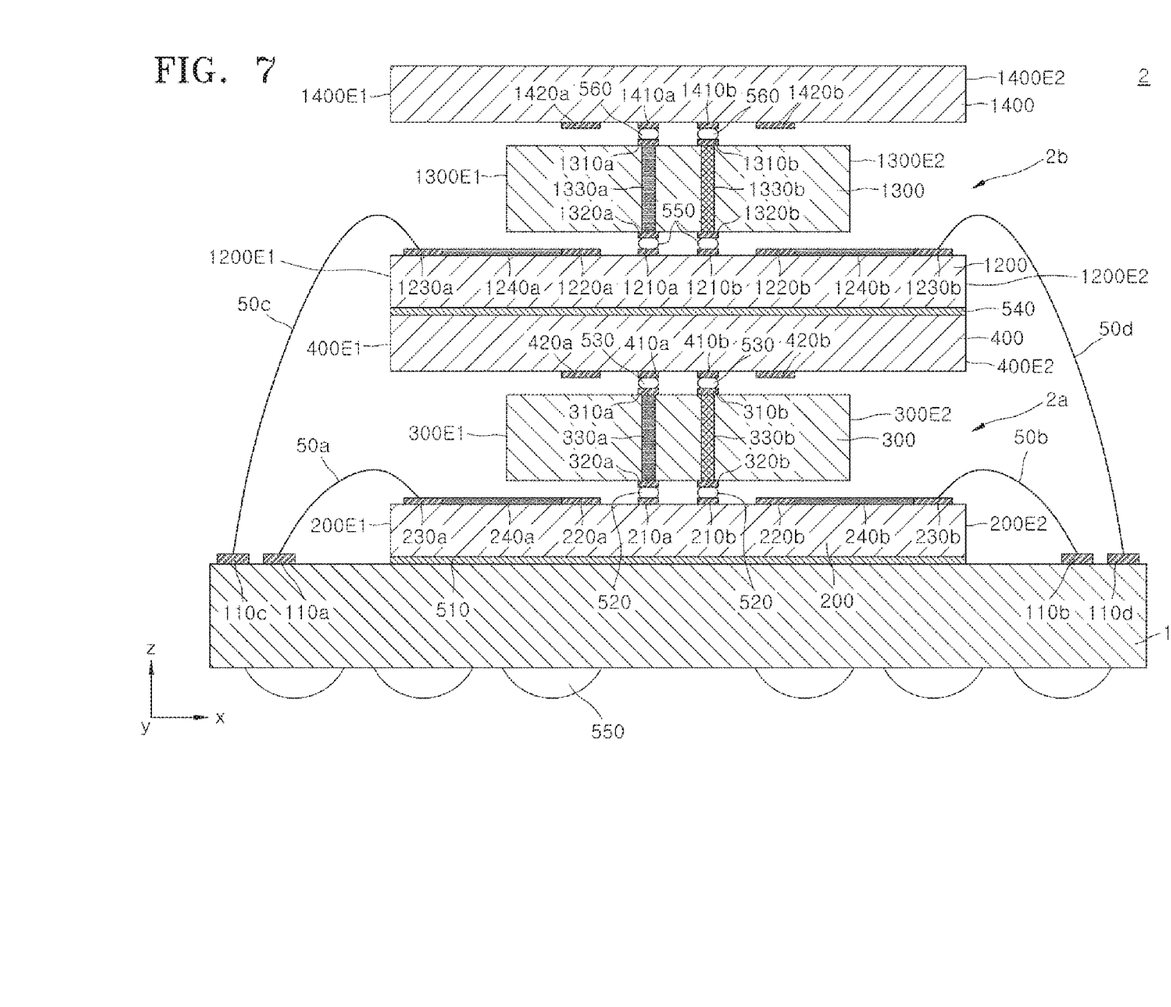
FIG. 7 is a cross-sectional view schematically illustrating a semiconductor package according to another embodiment of the present disclosure.

FIG. 7 is a cross-sectional view schematically illustrating a semiconductor package 2 according to another embodiment of the present disclosure. Referring to FIG. 7, the semiconductor package 2 may have a second lower chip 1200, a second interposer 1300, and a second upper chip 1400 that are further stacked on the semiconductor package 1 described above with reference to FIG. 1. In this case, the second lower chip 1200 may be electrically connected to connection pads 110c and 110d of the package substrate 100 by bonding wires 50c and 50d.

The semiconductor package 2 may include a package substrate 100, a first stack structure 2a disposed on the package substrate 100, and a second stack structure 2b disposed on the first stack structure 2a. The first stack structure 2a may include a first lower chip 200, a first interposer 300, and a first upper chip 400. The second stack structure 2b may include the second lower chip 1200, the second interposer 1300, and the second upper chip 1400. An adhesive layer 540 may be disposed between the first upper chip 400 of the first stack structure 2a and the second lower chip 1200 of the second stack structure 2b, so that the first stack structure 2a and the second stack structure 2b can be bonded to each other.

In addition, the semiconductor package 2 may include first bonding wires 50a and 50b electrically connecting the first lower chip 200 of the first stack structure 2a to the package substrate 100, and second bonding wires 50c and 50d electrically connecting the second lower chip 1200 of the second stack structure 2b to the package substrate 100.

The configurations of the first lower chip 200, the first interposer 300, and the first upper chip 400 of the first stack structure 2a may be the same as the configurations of the lower chip 200, the interposer 300, and the upper chip 400 of the semiconductor package 1 described above with reference to FIG. 1, That is, the components having the same reference numerals are substantially the same components, so that a repeated description for the components will be omitted here.

The configurations of the second lower chip 1200, the second interposer 1300, and the second upper chip 1400 of the second stack structure 2b may be substantially the same as the configurations of the first lower chip 200, the first interposer 300, and the first upper chip 400 of the first stack structure 2a. As an example, pads 1210a, 1210b, 1220a, and 1220b of the second lower chip 1200 may have the same configurations as pads 210a, 210b, 220a, and 220b of the first lower chip 200. In addition, wire bonding pads 1230a and 1230b of the second lower chip 1200 may have the same configurations as wire bonding pads 230a and 230b of the first lower chip 200. In addition, redistribution lines 1240a and 1240b of the second lower chip 1200 may have the same configurations as redistribution lines 240a and 240b of the first lower chip 200. In addition, pads 1410a, 1410b, 1420a, and 1420b of the second upper chip 1400 may have the same configurations as pads 410a, 410b, 420a, and 420b of the first upper chip 400. In addition, upper chip connection pads 1310a and 1310b, second through via electrodes 1330a and 1330b, and lower chip connection pads 1320a and 1320b of the second interposer 1300 may have the same configurations as upper chip connection pads 310a and 310b, first through via electrodes 330a and 330b, and lower chip connection pads 320a and 320b of the first interposer 300. The second lower chip 1200 and the second interposer 1300 may be electrically connected to each other by third bumps 550, and the second interposer 1300 and the second upper chip 1400 may be electrically connected to each other by fourth bumps 560.

The first lower chip 200 may be electrically connected to the package substrate 100 through the bonding wires 50a and 50b. The bonding wires 50a and 50b may electrically connect the wire bonding pads 230a and 230b of the first lower chip 200 to the connection pads 110a and 110b of the package substrate 100. On the other hand, after the first upper chip 400 is connected to the first lower chip 200 using the first interposer 300, the first upper chip 400 may be electrically connected to the package substrate 100 through the first lower chip 200.

The second lower chip 1200 may be electrically connected to the package substrate 100 through the bonding wires 50c and 50d. The bonding wires 50c and 50d may electrically connect the wire bonding pads 1230a and 1230b of the second lower chip 1200 to the connection pads 110c and 110d of the package substrate 100. On the other hand, the second upper chip 1400 may be electrically connected to the package substrate 100 via the second lower chip 1200, after being connected to the second lower chip 1200 using the second interposer 1300.

Referring to FIG, 7, edge portions of the first interposer 300 may be disposed at position recessed in the lateral direction (i.e., the direction parallel to the x-axis) from edge portions of the first upper chip 400 and edge portions of the first lower chip 200. As an example, both sidewall surfaces 300E1 and 300E2 of the first interposer 300 may be disposed at positions recessed in the lateral direction (Le., the direction parallel to the x-axis) from both sidewall surfaces 400E1 and 400E2 of the first upper chip 400 and both sidewall surfaces 200E1 and 200E2 of the first lower chip 200, respectively. Edge portions of the second interposer 1300 may be disposed at positions recessed in the lateral direction (i.e., the direction parallel to the x-axis) from edge portions of the second upper chip 1400 and edge portions of the second lower chip 1200. As an example, both sidewall surfaces 1300E1 and 1300E2 of the second interposer 1300 may be disposed at positions recessed in the lateral direction (i.e., the direction parallel to the x-axis) from both sidewall surfaces 1400E1 and 1400E2 of the second upper chip 1400 and both sidewall surfaces 1200E1 and 1200E2 of the second lower chip 1200, respectively.

In FIG. 7, although a semiconductor package structure is disclosed in which two stack structures 2a and 2b having substantially the same configuration are stacked on a package substrate 100, in some other embodiments, the number of stack structures stacked on the package substrate 100 might not be so limited. That is, in other embodiments, a semiconductor package in which at least three stack structures according to embodiments of the present disclosure are stacked on the package substrate 100 may be implemented.

As described above, an embodiment of the present disclosure provides a semiconductor package having a lower chip, an interposer and an upper chip that are sequentially stacked on a package substrate. In the semiconductor package, the lower chip may be connected to the package substrate using wire bonding. The upper chip may be connected to the lower chip through a through via electrode of the interposer and may be electrically connected to the package substrate via the lower chip.

In an embodiment of the present disclosure, the upper chip may be electrically connected to the package substrate through the interposer and the lower chip without direct connection to the package substrate. Accordingly, the upper chip might not apply an input/output pad and an input/output circuit related to wire bonding in order to exchange signals with the package substrate. As a result, during the operation of the semiconductor package, parasitic capacitance generated in the input/output pad and the input/output circuit of the upper chip can be reduced. As such, an embodiment of the present disclosure can provide a semiconductor package structure capable of reducing parasitic capacitance generated in a semiconductor chip, thereby improving performance such as signal transmission speed of the semiconductor package. As described above, an embodiment of the present disclosure has been disclosed and illustrated in the drawings. Various other modifications are possible in accordance with the technical spirit suggested of the present disclosure.

What is claimed is:

1. A semiconductor package comprising:
   a package substrate;
   a lower chip, an interposer, and an upper chip which are stacked on the package substrate; and
   bonding wires electrically connecting the lower chip to the package substrate,
   wherein the lower chip comprises:
   first and second lower chip pads spaced apart from each other on an upper surface of the lower chip and electrically connected to each other via a function block inside the lower chip through internal wirings;
   wire bonding pads bonded to the bonding wires on the upper surface of the lower chip; and
   lower chip redistribution lines disposed on the upper surface of the lower chip and the lower chip redistribution lines electrically connecting the second lower chip pad to the wire bonding pad,
   wherein the interposer comprises:
   an upper chip connection pad electrically connected to the upper chip on an upper surface of the interposer;
   a lower chip connection pad electrically connected to the first lower chip pad on a lower surface of the interposer; and
   a through via electrode electrically connecting the upper chip connection pad to the lower chip connection pad,
   wherein an electrical signal of the package substrate is transferred from the wire bonding pads to the second lower chip pad through the lower chip redistribution lines and the electrical signal is transferred from the second lower chip pad to the first lower chip pad via the function block, and
   wherein the function block comprises input/output circuit blocks, an address and command block and a data transmission circuit block,
   wherein the first lower chip pad comprises a first lower chip left pad and a first lower chip right pad that are configured in pairs and transmit different electrical signals with each other,
   wherein the lower chip connection pad comprises a lower left pad disposed directly over the first lower chip left pad and a lower right pad disposed directly over the first lower chip right pad,
   wherein the upper chip connection pad comprises an upper left pad disposed directly over the lower left pad and an upper right pad disposed directly over the lower right pad, and
   wherein the first lower chip left pad is electrically connected to the lower left pad and the upper right pad, and the first lower chip right pad is electrically connected to the lower right pad and the upper left pad.

2. The semiconductor package of claim 1, wherein the upper chip comprises:
   a first upper chip pad disposed on an upper surface of the upper chip facing the interposer; and
   a second upper chip pad spaced apart from the first upper chip pad in a lateral direction on the upper surface,
   wherein the first upper chip pad is connected to the upper chip connection pad, and the second upper chip pad is not electrically connected with the interposer.

3. The semiconductor package of claim 2, further comprising:
   a first bump disposed between the first lower chip pad and the lower chip connection pad; and
   a second bump disposed between the first upper chip pad and the upper chip connection pad.

4. The semiconductor package of claim 1, wherein the lower chip is directly and electrically connected to the package substrate, and
   wherein the upper chip is electrically connected to the package substrate through the interposer and the lower chip.

5. The semiconductor package of claim 1, wherein the lower chip comprises a pair of the first lower chip pads, a pair of the second lower chip pads, and a pair of the wire bonding pads, and
   wherein the upper chip comprises a pair of first upper chip pads.

6. The semiconductor package of claim 5, wherein the lower chip comprises:
   first and second input/output circuit blocks respectively connected to the pair of the second lower chip pads;
   a first address and command block connected to the first input/output circuit block;
   a first data transmission circuit block connected to the second input/output circuit block; and
   a first memory cell core block connected to the first address and command block and the first data transmission circuit block, and
   wherein the upper chip comprises:

a second address and command block and a second data transmission circuit block that are connected to the pair of upper chip pads, respectively; and a second memory cell core block connected to the second address and command block and the second data transmission circuit block.

7. The semiconductor package of claim 6, wherein the first and second input/output circuit blocks receive electric signals of the package substrate, respectively, transmitted through the bonding wires, the wire bonding pads, the lower chip redistribution lines, and the second lower chip pads;

the first and second input/output circuit blocks transmit the received electric signals to the first address and command block and the first data transmission circuit blocks, respectively, using internal wirings of the lower chip;

the first address and command block and the first data transmission circuit block receive the transmitted electric signals, respectively; and the first address and command block and the first data transmission circuit block transmit the received the electric signals to the first memory cell core block of the lower chip, respectively.

8. The semiconductor package of claim 7, wherein the interposer receives some of the electric signals of the package substrate through the first lower chip pads;

the interposer transmits the received electric signals to the first upper chip pads of the upper chip using the internal wirings of the interposer;

the second address and command block and the second data transmission circuit block receive the electric signals, respectively, transmitted to the first upper chip pads using the internal wirings of the upper chip; and the second address and command block and the second data transmission circuit block transmit the received electric signals to the second memory cell core block of the upper chip, respectively.

9. The semiconductor package of claim 1, wherein edge portions of the interposer are disposed at positions recessed in a lateral direction from edge portions of the upper chip and the lower chip.

10. The semiconductor package of claim 1, wherein the upper chip connection pads and the lower chip connection pads are each disposed in a pair symmetrical with respect to a central axis of the interposer.

11. The semiconductor package of claim 10, wherein the interposer comprises the upper left pad and the upper right pad that are symmetrical with respect to the central axis of the interposer, and comprises the lower left pad disposed to overlap the upper left pad and the lower right pad disposed to overlap the upper right pad, as the lower chip connection pads, and wherein the upper left pad is electrically connected to the lower right pad through a first through via electrode, and the upper right pad is electrically connected to the lower left pad through a second through via electrode.

12. The semiconductor package of claim 11, wherein the interposer comprises:

a first interposer redistribution line disposed on the upper surface of the interposer and electrically connecting the upper left pad to the first through via electrode;

a second interposer redistribution line disposed on the upper surface of the interposer and electrically connecting the upper right pad to the second through via electrode;

a third interposer redistribution line disposed on the lower surface of the interposer and electrically connecting the lower right pad to the first through via electrode; and a fourth interposer redistribution line disposed on the lower surface of the interposer and electrically connecting the lower left pad to the second through via electrode.

13. A semiconductor package comprising:

a package substrate;

a lower chip disposed on the package substrate and electrically connected to the package substrate through wire bonding;

an interposer disposed on the lower chip and including a through via electrode electrically connected to the lower chip; and an upper chip disposed on the interposer and electrically connected to the through via electrode, wherein the upper chip is electrically connected to the package substrate through the interposer and the lower chip, and wherein the lower chip comprises:

first and second lower chip pads spaced apart from each other on an upper surface of the lower chip and electrically connected to each other via a function block inside the lower chip through internal wirings;

wire bonding pads bonded to the bonding wires on the upper surface of the lower chip; and lower chip redistribution lines electrically connecting the second lower chip pad to the wire bonding pad, wherein an electrical signal of the package substrate is transferred from the wire bonding pads to the second lower chip pad through the lower chip redistribution lines and the electrical signal is transferred from the second lower chip pad to the first lower chip pad via the function block, and wherein the function block comprises input/output circuit blocks, an address and command block and a data transmission circuit block, wherein the first lower chip pad comprises a first lower chip left pad and a first lower chip right pad that are configured in pairs and transmit different electrical signals with each other, wherein the interposer comprises a lower chip connection pad on a lower surface of the interposer and an upper chip connection pad on an upper surface of the interposer, wherein the lower chip connection pad comprises a lower left pad disposed directly over the first lower chip left pad and a lower right pad disposed directly over the first lower chip right pad, wherein the upper chip connection pad comprises an upper left pad disposed directly over the lower left pad and an upper right pad disposed directly over the lower right pad, and wherein the first lower chip left pad is electrically connected to the lower left pad and the upper right pad, and the first lower chip right pad is electrically connected to the lower right pad and the upper left pad.

14. The semiconductor package of claim 13, wherein the first lower chip pad is connected to the through via electrode, and wherein the lower chip redistribution lines is disposed on the upper surface of the lower chip.

15. The semiconductor package of claim 14, wherein:

the upper chip connection pad is electrically connected to the upper chip on an upper surface of the interposer; and wherein the through via electrode electrically connects the lower chip connection pad to the upper chip connection pad.

16. The semiconductor package of claim 15, wherein the upper chip comprises an upper chip pad connected to the upper chip connection pad on an upper surface of the upper chip that faces the interposer.

17. The semiconductor package of claim 13, wherein edge portions of the interposer are disposed at positions recessed in a lateral direction from edge portions of the upper chip and the lower chip.

* * * * *